United States Patent
Nimran P A et al.

(10) Patent No.: US 8,920,326 B2
(45) Date of Patent: Dec. 30, 2014

(54) CANCELLATION OF PRODUCTS GENERATED BY HARMONICS OF A SQUARE WAVE USED IN SQUARE-WAVE MIXING

(75) Inventors: Vajeed Nimran P A, Bangalore (IN); Shabbir Amjhera Wala, Bangalore (IN); Shagun Dusad, Bangalore (IN); Sandeep Oswal, Bangalore (IN); Visvesvaraya Appala Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 713 days.

(21) Appl. No.: 13/208,347

(22) Filed: Aug. 12, 2011

(65) Prior Publication Data

US 2013/0039151 A1    Feb. 14, 2013

(51) Int. Cl.
  *G01S 7/52*    (2006.01)
  *H03D 1/22*    (2006.01)
  *G01S 15/89*    (2006.01)

(52) U.S. Cl.
  CPC ......... *G01S 7/52038* (2013.01); *G01S 7/52023* (2013.01); *H03D 1/2209* (2013.01); *G01S 15/8979* (2013.01)
  USPC .......................................... 600/454; 367/87

(58) Field of Classification Search
  CPC .................................................. H03D 1/2209
  See application file for complete search history.

(56) References Cited

U.S. PATENT DOCUMENTS

| | | | | |
|---|---|---|---|---|
| 4,416,286 | A | * | 11/1983 | Iinuma et al. ................. 600/441 |
| 4,509,526 | A | * | 4/1985 | Barnes et al. ................. 600/456 |
| 5,161,254 | A | * | 11/1992 | Braathen ....................... 455/306 |
| 5,239,139 | A | * | 8/1993 | Zuta .......................... 178/19.02 |
| 5,406,949 | A | * | 4/1995 | Yao et al. ..................... 600/457 |
| 2006/0205370 | A1 | * | 9/2006 | Hayashi et al. ............... 455/209 |
| 2009/0138744 | A1 | * | 5/2009 | Kasperkovitz ............... 713/401 |
| 2010/0249600 | A1 | * | 9/2010 | Kudoh et al. ................. 600/459 |

* cited by examiner

*Primary Examiner* — Ian J Lobo
*Assistant Examiner* — Hovhannes Baghdasaryan
(74) *Attorney, Agent, or Firm* — Alan A. R. Cooper; Frederick J. Telecky, Jr.

(57) ABSTRACT

A mixer circuit includes three square wave mixers and a combiner. A first square wave mixer in the circuit multiplies an input signal with a first square wave. A second square wave mixer and a third square wave mixer in the circuit each multiplies the input signal with a second square wave and a third square wave respectively. The second and third square waves have a same frequency as the first square wave, but phases that respectively lead and lag the phase of the first square wave by a first value. The combiner adds the outputs of the mixers. A low-pass filter external to the mixer circuit filters the sum generated by the combiner to generate a filtered output. In an embodiment, the first value equals forty five degrees, and the filtered output is rendered free of products generated by third and fifth harmonics of the first square wave square.

4 Claims, 5 Drawing Sheets

CANCELLATION OF PRODUCTS GENERATED BY HARMONICS OF A SQUARE WAVE USED IN SQUARE-WAVE MIXING

BACKGROUND

1. Technical Field

Embodiments of the present disclosure relate generally to electronic mixers, and more specifically to cancellation of products generated by harmonics of a square wave in square-wave mixing.

2. Related Art

Square wave mixing is often used for reasons of ease of implementation of an electronic mixer. Square wave mixing refers to an operation in which a signal is multiplied (mixed) with a square wave signal. As is well-known in the relevant arts, a square wave signal of frequency 'f' may be viewed as being composed of multiple sinusoids (theoretically, an infinite number of sinusoids). The sinusoids include a 'fundamental' sinusoid of frequency 'f', and odd harmonics of the fundamental sinusoid. Odd harmonics refer to sinusoids that have a frequency which is an odd multiple of the fundamental frequency 'f', i.e., frequencies 3f, 5f, 7f, etc.

A mixing operation of a signal (for example, another sinusoid) with a square wave may result in products generated by harmonics of the square wave. Some of such products generated by harmonics of the square wave may fall within a frequency band of interest of a system or component in which the square wave mixing is performed, thereby potentially degrading a desired mixer-product of interest. It may be desirable that such products generated by harmonics of a square wave used in square-wave mixing be reduced in amplitude or completely cancelled.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A circuit includes three mixers, and a combiner. A first mixer in the circuit multiplies an input signal with a first square wave to generate a first product. A second mixer in the circuit multiplies the input signal with a second square wave to generate a second product. The second square wave has a same frequency as the first square wave, but has a phase that leads the phase of the first square wave. A third mixer in the circuit multiplies the input signal with a third square wave to generate a third product. The third square wave has a same frequency as the first square wave, but has a phase that lags the phase of the first square wave. The combiner generates a sum of the first product, the second product and the third product.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

The drawing in which an element first appears is indicated by the leftmost digit(s) in the corresponding reference number.

DETAILED DESCRIPTION

Various embodiments are described below with several examples for illustration.

1. Example Environment

Figure 1:
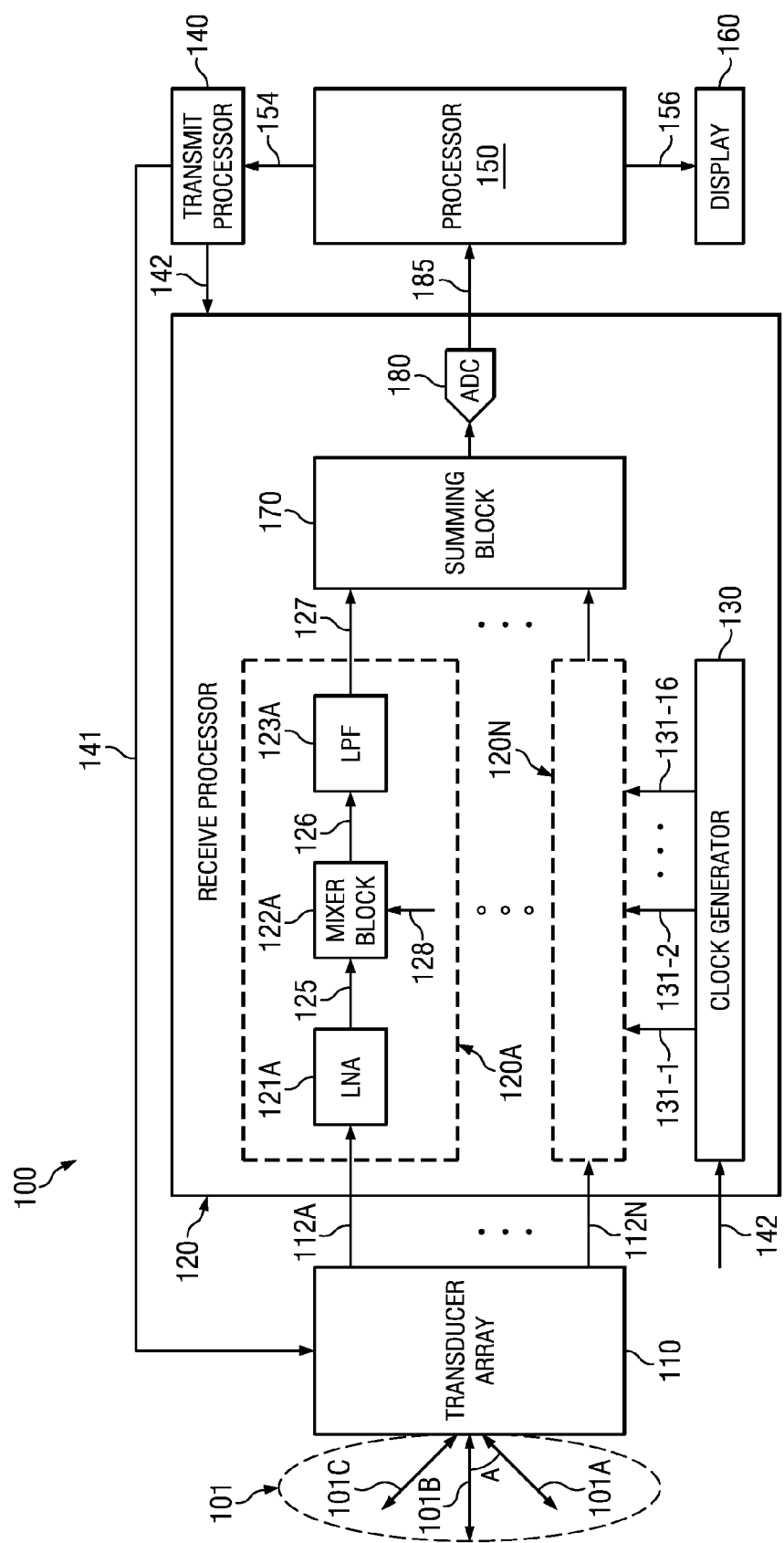
FIG. 1 is a block diagram of an example environment in which several embodiments can be implemented.

FIG. 1 is a block diagram illustrating an example environment in which several embodiments can be implemented. The diagram shows ultrasound system 100, which is in turn shown containing transducer array 110, receive processor 120, transmit processor 140, processor 150 and display 160. The details of ultrasound system 100 of FIG. 1 are meant to be merely illustrative, and real-world implementations may contain more blocks/components and/or different arrangement of the blocks/components.

Transmit processor 140 receives data representing a continuous wave (CW) signal (to be transmitted by transducer array 110) from processor 150 via path 154. Transmit processor 140 performs several operations on the received data, such as digital to analog conversion, filtering, amplification, etc. Transmit processor 140 provides the processed analog signal (referred to herein as transmit CW signal), thus generated, to transducers in transducer array 110 via path 141. The frequency of transmit CW signal 141 is represented by ftx.

Transducer array 110 contains an array of transducers to convert electrical signals to sound of ultrasonic frequency, and vice versa. The transducers in transducer array 110 may be arranged spatially in a desired pattern (for example, in a linear fashion, with transducers arranged side by side in a straight line). By controlling the characteristics, such as phase and amplitude, of the electrical signals provided as inputs (via path 141) to each of the transducers, transducer array 110 may be caused to transmit a pulse or a continuous wave (CW) signal (both indicated in FIG. 1 by label 101) in a desired direction or angle (A). As an illustration, arrows 101A, 101B and 101C are shown in FIG. 1 as three possible directions. Transducer array 110 may be housed in a fixed or movable unit.

When ultrasound system 100 is to operate to make velocity measurements, transducer array 110 receives on path 141, a continuous wave (CW) electrical signal (transmitted CW signal) at a desired transmit frequency ftx, as also noted above. Transducer array 110 converts the electrical signal on path 141 to a corresponding sound signal of ultrasonic frequency, and transmits the sound signal. Transducer array 110 may be positioned directionally and/or spatially so that the transmitted ultrasound signals impinge on the object whose velocity is desired to be measured. Transducers in transducer array 110 receive reflections from the object (e.g., flowing blood) in the form of ultrasound CW signals. The received reflections may have respective frequencies that may each be different from the transmit frequency (ftx) by a value proportional to the velocity of the object, due to the Doppler Effect.

In addition to the frequency shift, the phase of a reflected signal, as received at a transducer in transducer array 110, may be different from the phase of the transmitted CW signal 141. Further, reflections received at different points in space (or locations, for example, at different transducers in transducer array 110) may also have different phases with respect to each other. Typically, multiple reflected waves are processed to improve the accuracy of the velocity measurement. Hence, for optimal velocity measurement, each of the reflected signals typically needs to be mixed with a local oscillator (LO) signal of a corresponding 'correct' phase. Transducers in transducer array 110 convert the reflected CW ultrasound signals to corresponding electrical signals (also referred to herein as received CW signals), and forward the received CW signals on respective ones of paths 112A to 112N.

It is noted that when images are to be captured by ultrasound system 100, transducer array 110 may instead receive electrical pulses on path 141. After transmitting a pulse, the transducers in transducer array 110 may switch to receive mode. In receive mode, the transducers receive reflected pulses from various surfaces. The reflected pulses may be received along any direction. Transducers in transducer array 110 convert the received ultrasound pulses to corresponding electrical signals, and forward the electrical pulses to receive processor 120. Although all of the corresponding elements for processing the received electrical pulses are not shown in receive processor 120, such elements are assumed to be included in receive processor 120. Further, although not shown in FIG. 1, ultrasound system 100 may contain transmit and receive beam forming units to form corresponding transmit and receive beams.

Receive processor 120, which may be implemented as an integrated circuit (IC), receives from transducer array 110 (via corresponding paths 112A-112N), multiple received CW signals corresponding to reflected ultrasound signals representing reflections of transmitted CW signal 141. Receive processor 120 performs various operations on the received CW electrical signals such as, for example, amplification, mixing, filtering and analog to digital conversion, and provides the corresponding data, thus generated, to processor 150.

Receive processor 120 is shown containing clock generator 130, multiple processing chains or channels (120A through 120N), summing block 170 and analog to digital converter (ADC) 180. Each of chains 120A through 120N processes a signal received from a corresponding one of multiple (A through N) transducers (or transducer groups) in transducer array 110 on respective paths 112A through 112N. When operating to make velocity measurements, the frequencies of the outputs of transducers A through N may be different from one another due to velocity variations. Thus, multiple reflected CW signals (with respective frequencies fin1 through finN) are provided on respective paths 112A through 112N, and thus as inputs to respective processing chains 120A through 120N. In an embodiment, the number of signal chains (120A through 120N) equals eight. Each of the mixers in chains 120 through 120N receives one or more of the clock signals (e.g., 131-1 through 131-16 noted below) generated by clock generator 130, as described in sections below. When using CW signals, beam forming may be performed by mixing the received (reflected) signals (112A-112N) with corresponding phase of local oscillator signals (a corresponding one of clocks noted above) and summing the results of mixing.

Clock generator 130 receives a square wave (referred to herein also as a clock signal) on path 142. Signal 142 may be generated by an oscillator, not shown. Clock signal 142 has a frequency that may be the same as, or be a multiple of, the frequency (ftx) of the transmit CW signal generated on path 141. Clock generator 130 processes clock signal 142 to generate multiple clock signals (also referred to herein as local oscillator or LO signals), each with a frequency ftx, and with a corresponding phase. In an embodiment, clock signal 142 is a square wave having a frequency of 16*ftx, and clock generator 130 generates sixteen clock signals, each having a frequency of ftx, but having a corresponding one of sixteen phases. In the embodiment, the sixteen phases are of 0 degrees, 22.5 degrees, 45 degrees, 67.5 degrees, 90 degrees, 112.5 degrees, 135 degrees, 157.5 degrees, 180 degrees, 202.5 degrees, 225 degrees, 247.5 degrees, 270 degrees, 292.5 degrees, 315 degrees, and 337.5 degrees. Clock generator 130 provides each of the sixteen clocks noted above on paths 131-1 through 131-16 respectively. Clock generator 130 may be implemented in a known way, for example using frequency-divider techniques.

Processing chain 120A is shown containing low-noise amplifier (LNA) 121A, mixer block 122A, and low-pass filter (LPF) 123A. Each of the other chains (120B through 120N, only 120N is shown in FIG. 1) in receive processor 120 similarly contains respective LNAs, mixer blocks, and LPFs. Only such components as required for an understanding of this disclosure are shown, and each chain may contain more components/blocks.

LNA 121A receives a reflected CW signal on path 112A. The frequency of reflected CW signal 112A is represented by fin1. LNA 121A amplifies the signal 112A with minimal addition of noise, and forwards the amplified signal on path 125.

Figure 3:
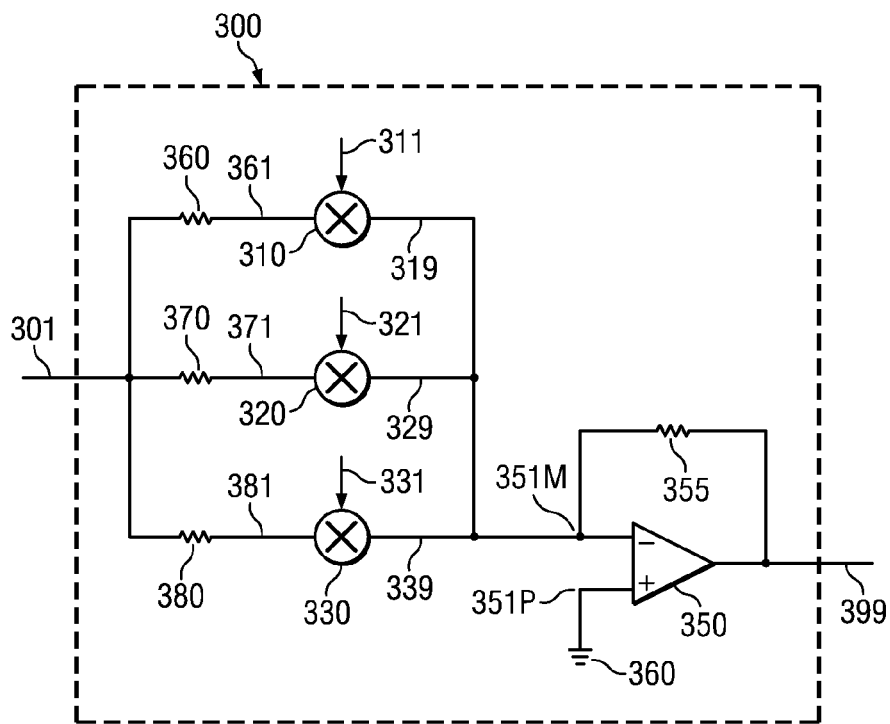
FIG. 3 is a block diagram of a mixer block in an embodiment.

Mixer block 122A multiples (i.e., mixes) amplified output 125 with each of three clock signals of the same frequency (ftx) but with phases spaced forty five degrees apart, as described in greater detail with respect to FIG. 3. Mixer block 122A adds the products generated by the mixing operation, and provides the sum of the products on path 126. Mixer block 122A receives each of the three clocks on path 128 (which is deemed to contain multiple paths) from clock generator 130.

In an embodiment, the three clocks provided by clock generator 130 to chain 120A have respective phases of $\phi$ degrees, ($\phi$−45) degrees and ($\phi$+45) degrees. In general, $\phi$ can have any one of the sixteen values provided by clock generator 130. Alternatively, the value of $\phi$ may be based on an estimate of the phase shift between transmit CW signal 141 and a received CW signal (the corresponding one of 112A through 112N). In an embodiment, $\phi$ has a value equaling the phase of any one of the clocks 131-1 through 131-N generated by clock generator 130. The clock with phase $\phi$ represents a local oscillator (LO) signal used for mixing with signal 125. Clocks with phases ($\phi$−45) degrees and ($\phi$+45) degrees are used to enable cancellation of undesired products due to the third and fifth harmonics of the clock with phase $\phi$, as described in detail below. For convenience, clocks with phases $\phi$ degrees, ($\phi$−45) degrees and ($\phi$+45) degrees are respectively referred to as clock $\phi$, clock ($\phi$−45) and clock ($\phi$+45).

LPF 123A performs low-pass filtering on output 126 of mixer block 122A to filter products of the mixing operation that are not of interest. LPF 123A forwards the filtered output on path 127.

Each of the other signal chains, 120B through 120N, similarly contains a corresponding LNA, mixer block, and LPF, and operates in a manner similar to signal chain 120A. Mixers in each of chains 120B through 120N receive a correspondingly different set of three clocks generated by clock generator 130. However, the phase relation between the three clocks provided to a mixer is maintained as noted above for mixer block 122A, i.e., the phases of the three clocks are always $\phi$ degrees, $(\phi-45)$ degrees and $(\phi+45)$ degrees, wherein the value of $\phi$ is different for each mixer block in chains 120A through 120N, and is selected to correspond to one of the clock phases generated by clock generator 130.

Summing block 170 adds the outputs of the LPFs of each of chains 120A-120N, and provides the sum thus obtained to ADC 180. ADC 180 converts the sum (which is in analog form) to corresponding digital values, and provides the digital values to processor 150 via path 185. ADC 180 may be implemented as a low-sampling-rate audio ADC. It is noted here that although ADC 180 is shown implemented within receive processor 120, ADC 180 may be implemented external to receive processor 120 as well. In an embodiment, the number of chains (120A-120N) equals eight.

Processor 150 generates data representing a CW signal (transmit CW signal 141) to be transmitted, and forwards the data to transmit processor 140 on path 154. Processor 150 receives, on path 185, the output of ADC 170. Processor 150 computes the velocity of a moving object based on signal 185. As is well-known in the relevant arts, velocity of an object changes the frequency of ultra-sound waves transmitted by transducer array 110. All reflected waves from the object, therefore, have a frequency (ftx+delta), the value of delta being dependent on the velocity of the object. Each mixer block in receive processor 120 mixes the corresponding reflected wave of frequency (ftx+delta) with a local oscillator with frequency ftx. Hence, the output of each of the mixer blocks contains a signal component with frequency 'delta'. Processor 150 operates to measure the value of 'delta' and thus computes the velocity of the object. Processor 150 forwards the computed velocity value to display 160 on path 156. Processor 150 may either display the velocity information and/or convert the velocity information to sound (played on a speaker, not shown). Processor 150 may be implemented using various approaches. For example, processor 150 may be implemented as a digital signal processor (DSP) to execute various algorithms to compute velocity.

As noted above, the frequency of a reflected CW signal differs from the transmitted CW signal 141 by a value that is indicative of the velocity that is to be measured. Thus, frequency fin1 of signal 125 differs from the frequency ftx of signal 141 by a value ((fin1−ftx), termed a difference-frequency, and noted above as 'delta') indicative of the velocity of the object which reflects the ultrasound CW signal corresponding to transmit CW signal 141. Each of chains 120B through 120N similarly generates a difference-frequency signal at frequency 'delta'. Summing block 170 adds the difference frequency signals to generate a final difference frequency signal of frequency 'delta' that has a sufficiently high magnitude to enable easier processing by processor 150.

The multiplication or mixing, in mixer block 122A, of signal 125 (or equivalently signal 112A) by three clocks with respective phases of $\phi$ degrees, $(\phi+45)$ degrees and $(\phi-45)$, followed by addition of the corresponding three products (or sets of products) enables cancellation of products generated by the third and fifth harmonics of the LO, i.e., the clock with phase $\phi$ degrees, as described in detail below. Similarly, mixing in respective mixers in chains 120B through 120N by corresponding three clocks with respective phases of $\phi$ degrees, $(\phi+45)$ degrees and $(\phi-45)$ (the value of $\phi$ being different in each chain), followed by addition of the corresponding three products enables cancellation of products generated by the third and fifth harmonics of the corresponding LO.

As is well known, multiplication of two sinusoids results in sum and difference frequencies of the two sinusoids. Assuming that only the clock with phase $\phi$ degrees (i.e., clock $\phi$) is used for mixing with received CW signal 125, the mixing operation would result in sum and difference frequencies of each sinusoidal component of clock $\phi$ and received CW signal 125. The difference frequency (fin1−ftx) represents a signal of interest, and is proportional to the velocity to be measured. Other (undesired) products include the sum frequency (fin1+ftx), and sum and difference frequencies of harmonics of clock $\phi$ and corresponding noise components (either contained in received CW signal 125 or inherently present in mixer block 122A), as illustrated below with respect to FIGS. 2A, 2B and 2C.

Figure 2A:
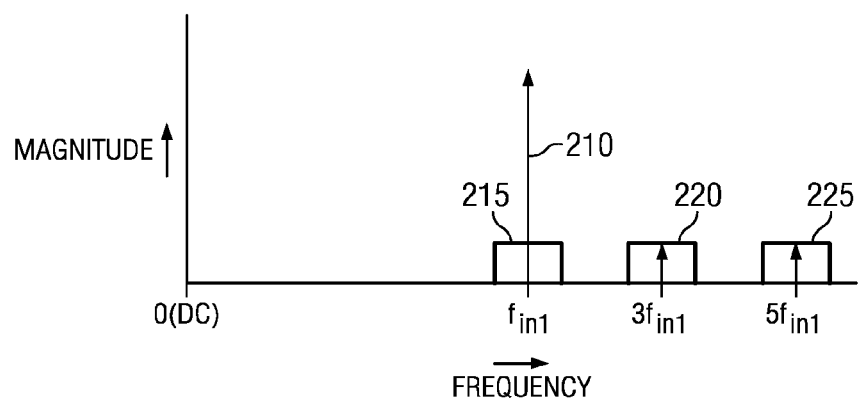
FIG. 2A is a diagram showing the frequency spectrum of a reflected continuous wave signal, in an embodiment.

FIG. 2A shows an example frequency spectrum of signal 125. Arrow 210 represents the magnitude of the reflected CW signal (after amplification) of frequency (fin1) on path 125. Marker 215 represents the noise power distribution in a frequency band centered at fin1. Similarly, markers 220 and 225 respectively represent the noise power distributions in corresponding frequency bands centered at (3*fin1) and (5*fin1). Noise 215 represents the sum of noise (in the frequency band centered at fin1) present in signal 210 and the noise (in the frequency band centered at fin1) in mixer block 122A. Noise 220 and 225 represent the noise (in the corresponding frequency bands) present in, or added by, mixer block 122A. Noise power distributions in other portions of the frequency spectrum in FIG. 2A are not indicated, although such other portions of the spectrum may also contain noise.

Figure 2B:
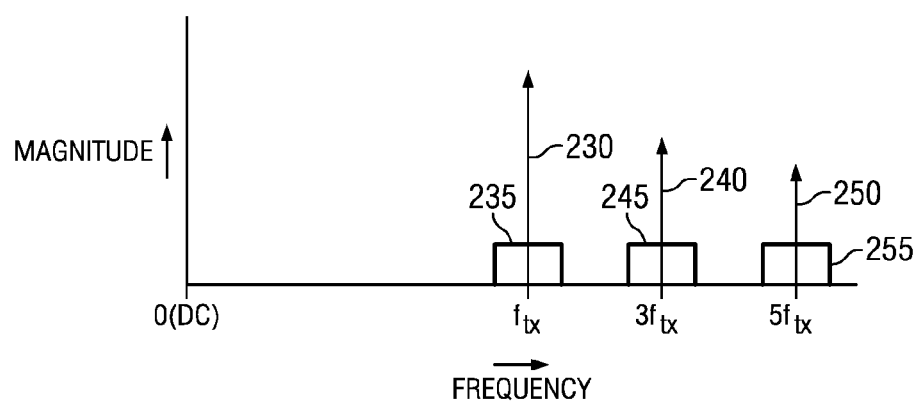
FIG. 2B is a diagram showing the frequency spectrum of a local oscillator signal, in an embodiment.

FIG. 2B shows an example frequency spectrum of square wave signal of phase $\phi$ (i.e., LO signal clock $\phi$ provided to mixer block 122A). Arrow 230 represents the magnitude of the fundamental sinusoid component of clock $\phi$. The fundamental sinusoid has the same frequency (ftx) as transmit CW signal 141. Arrow 240 represents the magnitude of the third harmonic component (frequency 3*ftx) of clock cp. Arrow 250 represents the magnitude of the fifth harmonic component (frequency 5*ftx) of clock cp. Higher odd harmonics, such as those with frequencies 7*ftx, 9*ftx, etc., may also be present, but not shown in FIG. 2B. The magnitudes of components 230, 240 and 250 are inversely proportional to their respective frequencies. Markers 235, 245 and 255 respectively represent the noise power distributions in corresponding frequency bands centered at ftx, 3*ftx and 5*ftx.

The mixing operation in mixer block 122A generates sum and difference frequencies of each of the signal and noise components shown in FIGS. 2A and 2B. Thus, for example, output 126 (FIG. 1) of mixer block 122A contains components of frequencies (fin1−ftx), (fin1+ftx), (3fin1−3ftx), (3fin1+3ftx), (5fin1−5ftx), and (5fin1+5ftx). Other sum and difference frequencies may also be present. Some of the other components include signals with frequencies such as (3fin1−ftx), (5fin1−ftx), (5fin−3ftx), etc.

Figure 2C:
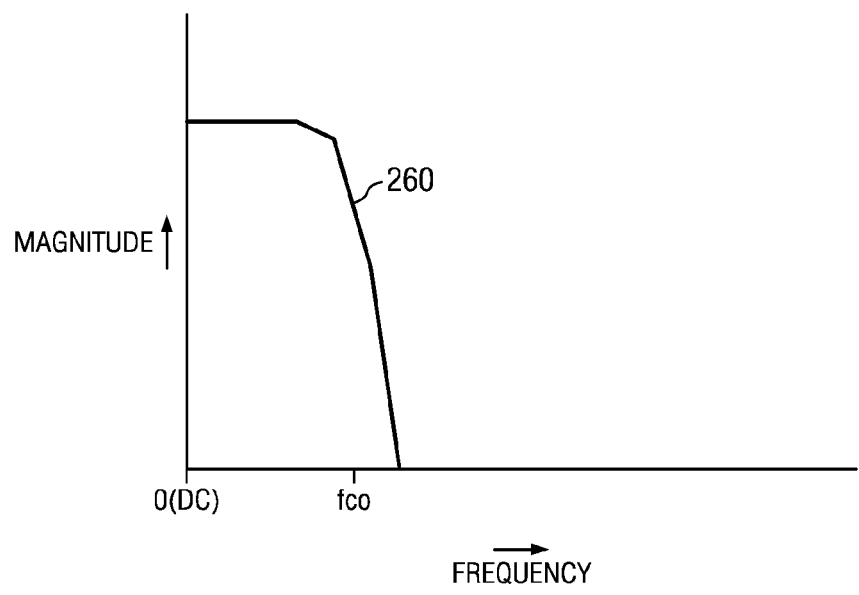
FIG. 2C is a diagram showing the frequency response of a low-pass filter used in a receive processor of an ultrasound system, in an embodiment.

LPF 123A is designed to filter-out all frequency components except the signal of interest (fin1−ftx), which provides a measure of velocity of the object that reflects the ultrasound CW signal generated from transmit CW signal 141. Curve 260 in FIG. 2C represents the frequency response of LPF 123A, with fco representing the 3 dB cut-off frequency. Thus, LPF 123A passes all components of the mixing process generated on path 126 that have frequencies less than fco. Frequency components greater than or equal to fco are attenuated. Cut-off frequency fco may be determined based on a maximum expected frequency shift due to the Doppler Effect. Width of each of frequency bands 220 and 225 (of FIG. 2A) corresponds approximately to fco of LPF 123A.

One problem with square wave mixing is that harmonics of clock φ, i.e., components of clock φ with frequencies 3*ftx, 5*ftx, etc., mix with noise of corresponding frequencies (e.g., noise 220 and noise 225 respectively) to generate frequency components that have frequencies equal to or very close to the frequency of the signal of interest (fin1−ftx). Thus, for example, the third harmonic (3*ftx) may mix with noise frequency 220 centered at (3*fin1) to generate product (3fin1−3ftx), which has a frequency very close to that of the signal of interest (fin1−ftx). Third harmonic (3*ftx) may also generate other frequency components having frequencies very close to the signal of interest (fin1−ftx). For example, products of 3*ftx with other frequencies in frequency band 220 may have frequencies at or close to that of the signal of interest (fin1−ftx). Such components having frequencies close to that of the signal of interest (fin1−ftx) may not be attenuated sufficiently (or attenuated at all) by LPF 123A. Hence the signal on path 127 (FIG. 1) may include such frequency components in addition to the signal of interest (fin1−ftx). Such additional frequency components increasing the noise level in the frequency band of interest (DC to fco in FIG. 2C), thereby potentially resulting in errors in the computation of velocity performed by processor 150.

Similarly, fifth harmonic (5*ftx) may mix with noise frequency (5*fin1) in band 225, thereby generating a component with frequency (5fin1−5ftx), which may be very close to that of the signal of interest (fin1−ftx). Fifth harmonic (5*ftx) may also generate other frequency components having frequencies very close to the signal of interest (fin1−ftx). For example, products of component (5*ftx) with other frequencies in noise frequency band 225 may also have frequencies equaling or very near to that of the signal of interest (fin1−ftx). Higher odd harmonics, such as 7*ft of clock φ may also result in products that have frequencies close to that of the signal of interest (fin1−ftx).

Thus, higher harmonics (3*ftx, 5*ftx, etc.) of clock φ may generate mixing products that may not be rejected (or sufficiently rejected) by LPF 123A. In general, the presence of such undesirable products in the frequency band of interest (DC to fco) increases the noise level in the band (DC to fco), and renders measurement of the signal of interest (i.e., difference-frequency (fin1−ftx)) less accurate. Each of the other signal chains 120B through 120N may have a similar drawback. In an embodiment of ultrasound system 100, transmit CW signal 141 and each of receive CW signals 112A through 112N have frequencies in the range 2 MHz to 10 MHz, and the signals of interest (fin1−ftx), (fin2−ftx), (fin2−ftx), etc., fall within a frequency band of interest of 0 Hz through 10 KHz.

Several embodiments of the present disclosure enable reduction in magnitude, or complete cancellation, of undesirable products generated by at least some of the harmonics of a square wave used as a local oscillator in square-wave mixing, as described next with respect to example embodiments.

2. Mixer Block

FIG. 3 is a block diagram of a mixer block in an embodiment. Mixer block 300 is shown containing mixers 310, 320 and 330, resistors 360, 370, 380 and 355, and operation amplifier (OPAMP) 350. Terminal 360 represents a ground terminal. Mixer block 122A as well as other mixer blocks of chains 120B-120N of FIG. 1 may be implemented as mixer block 300. When mixer 122A is implemented as mixer block 300, paths 301 and 399 correspond respectively to paths 125 and 126 of FIG. 1, and paths 311, 321 and 331 are assumed to be contained in path 128. Mixer block 300 receives a reflected CW signal on path 301.

Mixer 310 (first mixer) multiplies input signal 301, received via resistor 360 on input terminal 361 of mixer 310, by a square wave (LO signal) received on path 311. The square wave on path 311 (first square wave) has a same frequency (ftx) as a transmitted CW wave (e.g., signal 141 of FIG. 1), and a phase cp. The phase (φ) of square wave 311 may be arbitrarily selected or determined based on an estimated phase shift between a transmitted CW signal (e.g., signal 141 of FIG. 1) and a corresponding received CW signal (e.g., any one of signals 112A through 112N). Mixer 310 generates the products of the mixing operation on path 319 (first product).

Mixer 320 (second mixer) multiplies input signal 301, received via resistor 370 on input terminal 371 of mixer 320, by a square wave received on path 321. The square wave received on path 321(second square wave) has the same frequency (ftx) as square wave 311, but has a phase (φ+45) that leads the phase of square wave 311 by forty five degrees. Mixer 320 generates the products of the mixing operation on path 329 (second product).

Mixer 330 (third mixer) multiplies input signal 301, received via resistor 380 on input terminal 381 of mixer 330, by a square wave received on path 331. The square wave received on path 331(third square wave) has the same frequency (ftx) as square wave 311, but has a phase (φ−45) that lags the phase of square wave 311 by forty five degrees. Mixer 320 generates the products of the mixing operation on path 339 (third product). Square wave signals on paths 311, 321 and 331 are generated by clock generator 130 of FIG. 1, and correspond respectively to clock φ, clock (φ+45) and clock (φ−45) noted above with respect to FIG. 1.

Figure 4:
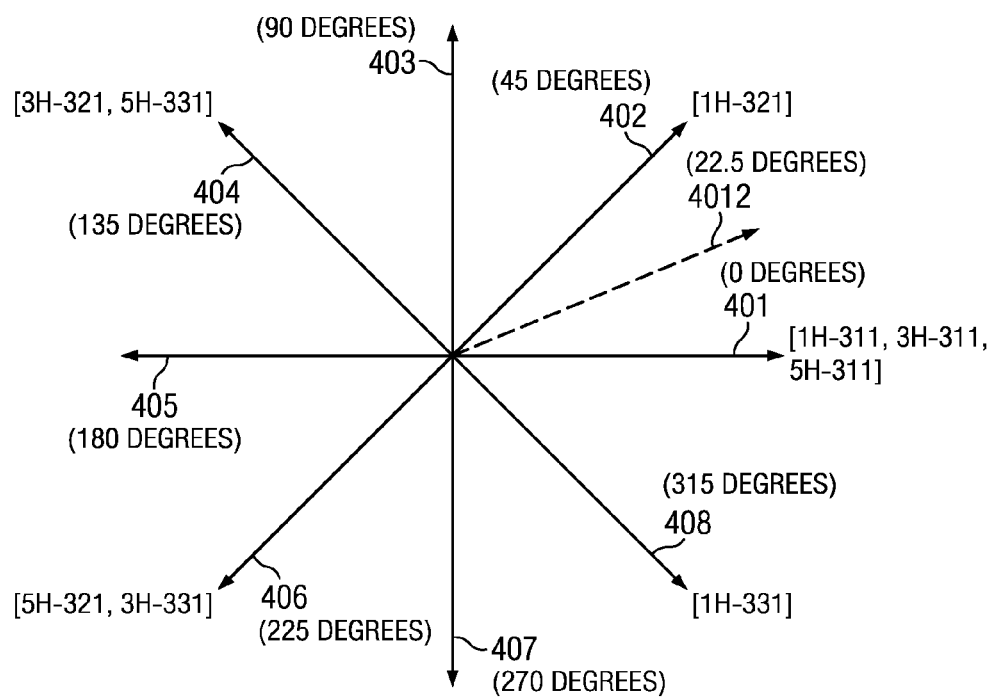
FIG. 4 is a diagram showing phasors representing signals with corresponding phases.

FIG. 4 shows a phasor diagram. Phasors 401, 402, 403, 404, 405, 406, 407 and 408 respectively represent sinusoids (of unit magnitude) with respective phases of 0 degrees, 45 degrees, 90 degrees, 135 degrees, 180 degrees, 225 degrees, 270 degrees, and 315 degrees. 0 degrees also corresponds to 360 degrees. In FIG. 4, rotating a phasor in a counter clockwise direction is assumed to advance the phase of the phasor. Thus, phasor 402 leads phasor 401 by 45 degrees. Representing phasor 401 by ph0, the phase represented by phasor 402 is (ph0+45). Rotating a phasor in a clockwise direction is assumed to retard the phase of the phasor. Thus, phasor 408 lags phasor 401 by 45 degrees, i.e., the phase represented by phasor 402 is (ph0−45). Phasor 408 may also be viewed as leading phasor 401 by 315 degrees, as noted in FIG. 4. Similarly, phasor 402 may also be viewed as lagging phasor 401 by 315 degrees. Only nine phasors are shown in FIG. 4. Phasors corresponding to phases 67.5 degrees, 112.5 degrees, 157.5 degrees, 202.5 degrees, 247.5 degrees, 292.5 degrees, and 337.5 are not shown in FIG. 4.

Referring again to FIG. 3, outputs 319, 329 and 339 of respective mixers 310, 320 and 330 are added in a combiner (or summing block). In FIG. 3, the addition is achieved by connecting the outputs 319, 329 and 339 to a summing junction (inverting terminal 351M) of OPAMP 350. The non-inverting terminal (351P) is connected to a ground potential. The configuration of OPAMP 350 of FIG. 3 may, therefore, be viewed as a combiner. In other embodiments, a combiner may be implemented using other techniques.

The ratio of resistances of resistor 355 and resistor 360 sets the value of the gain provided to the signal on path 319. The ratio of resistances of resistor 355 and resistor 370 sets the value of the gain provided to the signal on path 329. The ratio of resistances of resistor 355 and resistor 380 sets the value of the gain provided to the signal on path 339. By appropriate selection of the ratios of the resistances noted above, the summed (and amplified) signal (mixer output) provided on path 399 may be rendered free of products due to the third and fifth harmonics of square wave LO signal 311, as described below.

Assume that square wave LO signal 311 corresponds to phasor 401 of FIG. 4, i.e., signal 311 has a phase of 0 degrees. Hence, each of the third harmonic (denoted for convenience as 3H-311) and fifth harmonic (5H-311) of square wave 311 is also at zero phase with respect to the fundamental. Therefore, the fundamental of 311 (1H-311), third harmonic (3H-311) and fifth harmonic (5H-311) each have phases represented by phasor 401 of FIG. 4.

Square wave 321 leads the phase of square wave 311 by forty five degrees. Hence, the phase of the fundamental (1H-321) of square wave 321 is represented by phasor 402. The third harmonic (3H-321) has a phase of 135 degrees with respect to reference phasor 401, and the phase of 3H-321 is represented by phasor 404. The fifth harmonic (5H-321) has a phase of 225 degrees with respect to reference phasor 401, and the phase of 5H-321 is represented by phasor 406.

Square wave 331 lags the phase of square wave 311 by forty five degrees. Hence, the phase of the fundamental (1H-331) of square wave 331 is represented by phasor 408. The third harmonic (3H-331) has a phase of 225 degrees with respect to reference phasor 401, and the phase of 3H-331 is represented by phasor 406. The fifth harmonic (5H-331) has a phase of 135 degrees with respect to reference phasor 401, and the phase of 5H-331 is represented by phasor 404. The phases of the respective fundamental components, third harmonics and fifth harmonics of square waves 311, 321 and 331 are shown in FIG. 4.

It may be appreciated from the description above, and from FIG. 4, that addition of third harmonics 3H-321 and 3H-331 generates a 'third harmonic sum' that has a phase of 180 degrees (i.e., along phasor 405) with respect to reference phasor 401. Similarly, addition of fifth harmonics 5H-321 and 5H-331 generates a 'fifth harmonic sum' that also has a phase of 180 degrees (i.e., along phasor 405) with respect to reference phasor 401. With appropriate weighting of the third harmonics 3H-321 and 3H-331, the magnitude of the 'third harmonic sum' can be made equal to the magnitude of (but 180 degrees opposite in phase to) the third harmonic (3H-311) of square wave 311, thereby cancelling the third harmonic 3H-311.

Similarly, with appropriate weighting of the fifth harmonics 5H-321 and 5H-331, the magnitude of the 'fifth harmonic sum' can be made equal to the magnitude of (but 180 degrees opposite in phase to) the fifth harmonic (5H-311) of square wave 311, thereby cancelling the fifth harmonic 5H-311. The sum of the fundamental components 1H-321 and 1H-331 generates a fundamental component of zero phase, which adds with the fundamental component 1H-311 of square wave 311.

Thus, by appropriately scaling the magnitudes of square wave 321 and square wave 331, the third and fifth harmonics of square wave 311 are exactly canceled. In an embodiment of mixer block 300, each of square waves 321 and 331 is generated with a magnitude equaling $(1/\sqrt{2})$ times the magnitude of square wave 311, wherein $\sqrt{}$ represents a square root operator. Alternatively, the gain provided to the signals on each of paths 319, 329 and 339 may be selected appropriately to enable cancellation of the third and fifth harmonics in the product generated on path 399. Thus, in the circuit of FIG. 3, each of resistors 370 and 380 may be implemented with a resistance that is $\sqrt{2}$ times the resistance of resistor 360. Output 399 of mixer block 300 is thus rendered free of the third and fifth harmonics, and therefore products that may otherwise be generated by the third and fifth harmonics.

It may be appreciated that the phases of square waves 321 and 331 need be ($\phi$+45) and ($\phi$−45) respectively with respect to the phase $\phi$ of LO 311, and the amplitudes of square waves 321 and 331 need each be $1/\sqrt{2}$ of the magnitude of square wave 311 only if complete cancelation of the third and fifth harmonics of square waves 311, 321 and 331 is desired, i.e., only if third harmonics and fifth harmonics of square waves 311, 321 and 331 are desired to be completely removed from mixer block 300. When only a reduction in magnitudes (and not complete cancelation) of the third and fifth harmonics of square waves 311, 321 and 331 is sufficient, the phases of square waves 321 and 331 may be designed to have other values that are close to ($\phi$+45) and ($\phi$−45) values noted above. As an example, values ($\phi$+48) and ($\phi$−43) for the phases of square waves 321 and 331 may be used.

Techniques similar to those noted above may be employed to cancel (or reduce in magnitude) other harmonics (and therefore the corresponding products generated in a mixing operation) such as seventh harmonic, ninth harmonic, etc. However, it is noted that the magnitudes, and thus the resulting products due to harmonics higher than the fifth harmonic, may be very small, and their presence may not degrade velocity computation substantially. Hence, in an embodiment, only third and fifth harmonics are canceled in mixer block 300 (and, therefore, in ultrasound system 100).

With combined reference to FIG. 3 and FIG. 4, when $\phi$ is represented by phasor 401, ($\phi$+45) and ($\phi$−45) are respectively represented by phasors 402 and 408, and clock $\phi$, clock ($\phi$+45) and clock ($\phi$−45) are provided by clock generator 130 on paths 311-1, 311-3 and 311-15. Each of the other chains 120B through 120N uses a correspondingly different value of $\phi$. Thus, for example, the mixer block in chain 120B may use a value of $\phi$ equaling 45 degrees, as represented by phasor 402. Therefore, the corresponding values of ($\phi$+45) and ($\phi$−45) are respectively represented by phasors 403 and 401, and clock $\phi$, clock ($\phi$+45) and clock ($\phi$−45) correspond to clocks provided by clock generator 130 on paths 311-3, 311-5 and 311-1.

Figure 5A:
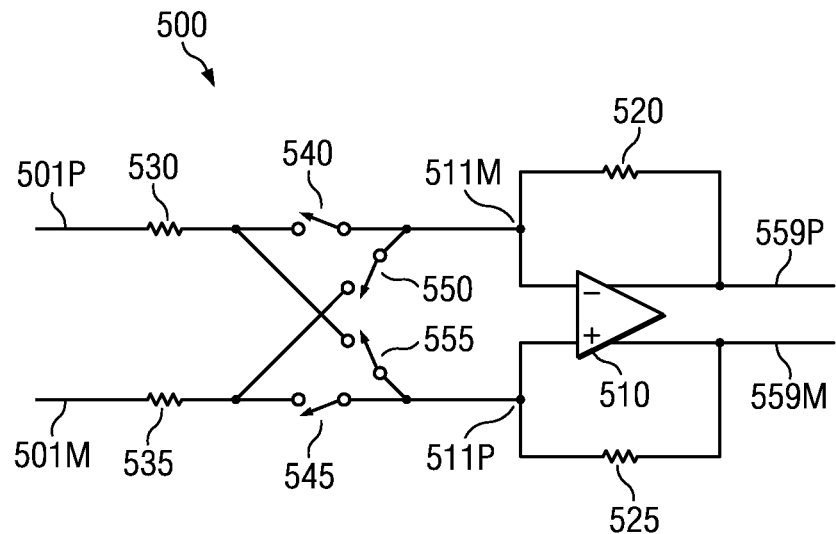
FIG. 5A is a circuit diagram of an implementation of a square wave mixer in an embodiment.

FIG. 5A is a circuit diagram of an implementation of a square wave mixer in an embodiment. Mixer 500, which may be implemented in place of one or more of mixers 310, 320 and 330 of FIG. 3, is shown containing operational amplifier (OPAMP) 510, gain-setting resistors 520, 525, 530 and 535, switches 540, 545, 550 and 555. Mixer 500 is shown implemented to process differential signals. However, a square wave mixer may also be implemented to process single-ended signals, as is well-known in the relevant arts. Mixer 500 receives a differential input signal across terminals 501P and 501M, and generates mixer outputs across differential terminals 559P and 559M.

Figure 5B:
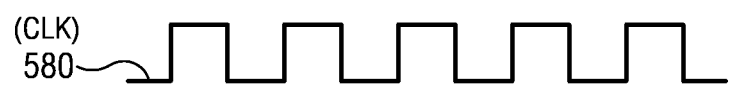
FIG. 5B illustrates waveforms of clock signals used in a square wave mixer, in an embodiment.
Figure 5B:

FIG. 5B illustrates waveforms of clock signals used to operate switches 540, 545, 550 and 555 of square wave mixer 500. Switches 540 and 545 are operated to be closed or open by clock waveform 580 (CLK). Switches 550 and 555 are operated to be closed or open by clock waveform 590 (CLK-B), which is the logical inverse of CLK. CLK-B may be generated by inverting CLK using a logic inverter. Waveform 580 represents a square wave of a desired frequency which is to be mixed with input signal 501P/501M.

When mixer 500 is implemented in place of mixer 310 of FIG. 3, signal CLK corresponds to square wave 311, and has a frequency (ftx). Differential terminals 501P/501M correspond to input terminal 361, and differential terminals 559P/559M correspond to output terminal 319.

When mixer 500 is implemented in place of mixer 320, signal CLK corresponds to square wave 321, differential terminals 501P/501M correspond to input terminal 371, and differential terminals 559P/559M correspond to output terminal 329. When mixer 500 is implemented in place of mixer 330, signal CLK corresponds to square wave 331, differential terminals 501P/501M correspond to input terminal 381, and differential terminals 559P/559M correspond to output terminal 339.

When CLK is at logic high, switches 540 and 545 are closed, switches 550 and 555 are open, and the signal across terminals 501P and 501M is applied across input terminals 501M and 501P of OPAMP 510. When CLK-B is at logic high, switches 540 and 545 are open, switches 550 and 555 are closed, and the signal across terminals 501P and 501M is applied across input terminals 501P and 501M of OPAMP 510, i.e., the input signal is applied across terminals 511M and 511P with reverse polarity. The operation of the switches multiplies input signal 501P/501M with +1 during logic high intervals of CLK and by −1 during logic high intervals of CLK-B, with the multiplication being done at the frequency of signal CLK.

While mixer 500 is shown as one possible implementation of any of mixers 310, 320 and 330 of mixer block 300, other implementations are also possible, as may be apparent to one skilled in the relevant arts.

In an alternative embodiment of receive processor 120, clock generator 130 receives, on path 142, a clock of frequency 8*ftx instead of a clock with frequency 16*ftx. Hence, clock generator 130, implemented as a frequency divider (as noted above), generates only eight clocks. Each of the eight clocks is generated to have a frequency of ftx, but with respective phases of 0 degrees, 45 degrees, 90 degrees, 135 degrees, 180 degrees, 225 degrees, 270 degrees, and 315 degrees. As may be appreciated, third and fifth harmonic cancelation in such an embodiment may not be possible for some of the phases. For example, an LO signal with phase φ (i.e., clock φ) equaling 22.5 degrees is not available. Clocks (φ−45) and (φ+45) correspond to phases 62.5 and 337.5 degrees respectively and are not available either.

In such an embodiment, mixing of the corresponding input signal (the corresponding one of inputs 112A through 112N) with a clock of any of phases 22.5 degrees, 67.5 degrees, 112.5 degrees, 157.5 degrees, 202.5 degrees, 247.5 degrees, 292.5 degrees, and 337.5 is performed in the following manner. To mix an input signal with a third and fifth-harmonic-free clock of phase 22.5 degrees, the input signal is mixed with each of clocks with phases 0 degrees, +45 degrees, −45 degrees and +90 degrees, the mixing being performed with the appropriate weights. Mixing an input signal with equal weights of clocks of phases 0 degrees and +45 degrees provides effectively mixes the input signal with a clock of 22.5 degrees. However, the mixing product is not free from third and fifth harmonics. But, if the clocks of phases 0 degrees and +45 degrees were themselves free of third and fifth harmonics, then mixing the input signal with such with such 0-degree phase and +45-degree phase clocks is equivalent to mixing the input signal with a clock of phase +22.5 degrees free from third and fifth harmonics.

It may be appreciated from the description above that mixing an input signal with appropriately weighted clocks of phases 0 degrees, +45 degrees and −45 degrees and summing the mixing results is equivalent to mixing the input signal with a third and fifth-harmonic free clock of phase 0 degrees. Similarly, mixing an input signal with appropriately weighted clocks of phases 0 degrees, +45 degrees and +90 degrees and summing the mixing results is equivalent to mixing the input signal with a third and fifth-harmonic free clock of phase +45 degrees. Hence, in the embodiment, to obtain third and fifth harmonic-free product of the input signal and a clock of phase 22.5 degrees, the input signal is mixed with appropriately weighted clocks of phases −45degrees, 0 degrees, +45 degrees and +90 degrees, and the individual mixing products are summed.

Figure 6:
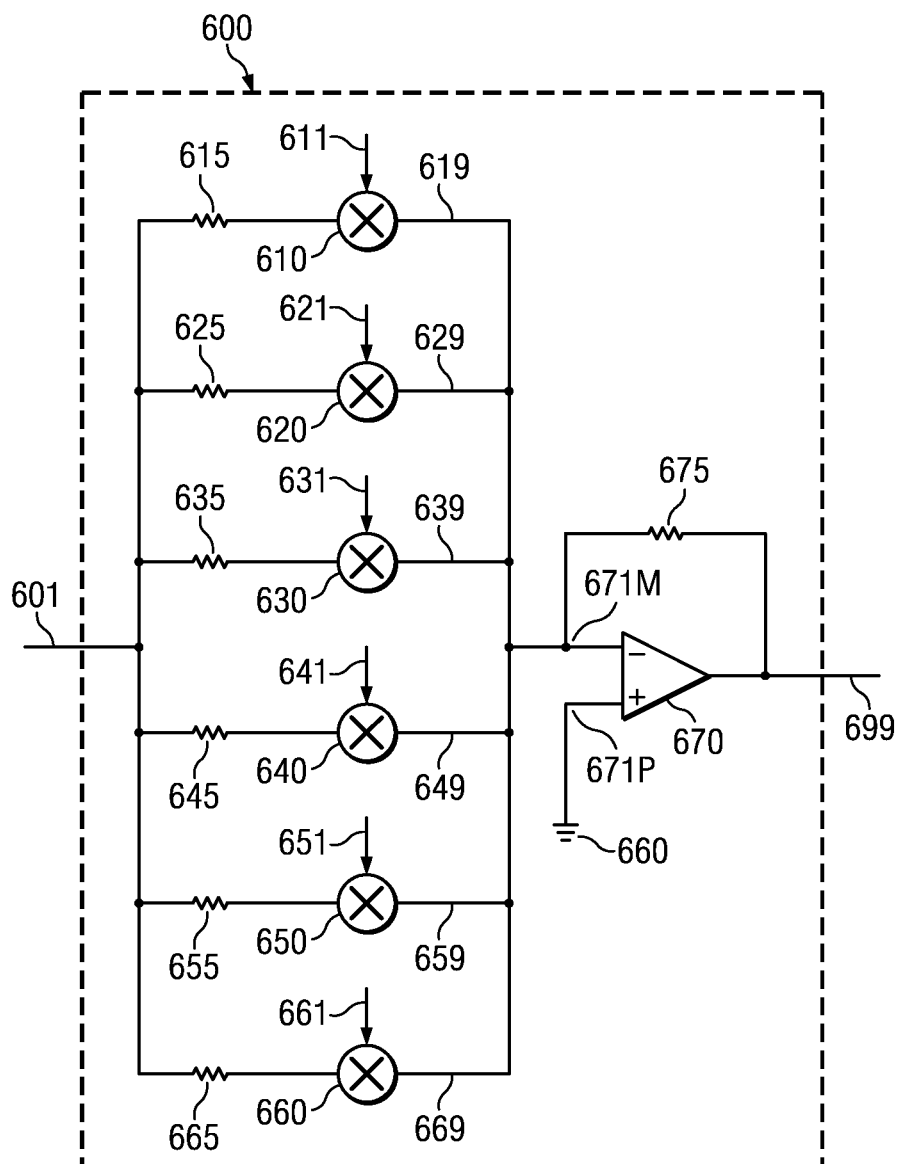
FIG. 6 is a block diagram of a mixer block in another embodiment.

FIG. 6 is a diagram of a mixer block (600) that can be used to obtain third and fifth harmonic-free mixer products of an input signal (601) and a clock of phase 22.5 degrees. FIG. 6 is shown containing mixers 610, 620, 630, 640, 650 and 660, resistors 615, 625, 635, 645, 656, 665 and 675, and amplifier 670. Nodes 671M and 571P represent respectively the inverting and non-inverting terminals of amplifier 670. Paths 611, 621, 631, 641, 651 and 661 receive clocks with respective phases 0 degrees, +45 degrees, −45 degrees, 0 degrees, +45 degrees and +90 degrees. Input signal 601 may correspond to the input of a corresponding mixer in chains 120A-120N. When mixer block 600 is implemented in place of mixer block 122A, paths 610 and 699 correspond respectively to paths 125 and 126 of FIG. 1.

The ratio of the resistance of resistor 675 to each of resistances of resistors 615, 625, 635, 645, 655 and 665 sets the gain of the signals on respective paths 619, 629, 639, 649, 659 and 669. The weights corresponding to the signals on paths 619, 629, 639, 649, 659 and 669 respectively equal 1, 1/sqrt(2), 1/sqrt(2), 1/sqrt(2), 1, and 1/sqrt(2). Correspondingly, ratio of the resistances of each of resistors 615, 625, 635, 645, 655 and 665 with respect to the resistance of resistor 675 are selected to equal 1, $\sqrt{2}$, $\sqrt{2}$, $\sqrt{2}$, 1 and $\sqrt{2}$ respectively. Alternatively, arms corresponding to a same phase can be combined and given the effective weight. For example, signals 611 and 641 are of zero-degree phase. Hence the corresponding arms (or signals 619 and 649) can be combined and weighted with a weight of (1+1/sqrt(2)).

Mixing of an input signal with clocks of phases 67.5 degrees, 112.5 degrees, 157.5 degrees, 202.5 degrees, 247.5 degrees, 292.5 degrees, and 337.5 degrees to obtain corresponding mixer products that are free of third and fifth harmonics may be performed in a manner similar to that described above by appropriate selection of the clock phases provided on paths 611-661 and corresponding resistor ratios.

Mixer blocks implemented as described above enable cancellation of products generated by harmonics of a square wave used in square-wave mixing. When used in an ultrasound system, such mixer blocks enable reduction of noise level in the frequency band of interest, and thereby enable a more accurate measurement of velocity.

In the illustrations of FIGS. 1, 3, 5A and 6, although terminals/nodes are shown with direct connections to various other terminals, it should be appreciated that additional components (as suited for the specific environment) may also be present in the path, and accordingly the connections may be viewed as being electrically coupled to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A circuit comprising:
a first mixer coupled to receive an input signal, the first mixer to multiply the input signal with a first square wave to generate a first product, the first square wave having a first frequency, a first amplitude, and a first phase;
a second mixer coupled to receive the input signal, the second mixer to multiply the input signal with a second square wave to generate a second product, wherein a frequency of the second square wave equals the first frequency, and a phase of the second square wave leads the first phase by a first value;
a third mixer coupled to receive the input signal, the third mixer to multiply the input signal with a third square wave to generate a third product, wherein a frequency of the third square wave equals the first frequency, and a phase of the third square wave lags the first phase by a second value; and
a combiner coupled to receive the first product, the second product and the third product, the combiner to generate a first sum of the first product, the second product and the third product,
wherein each of the first value and the second value equals forty five degrees, whereby third and fifth harmonics of the first square wave are canceled and the first sum is rendered free of mixing products due to the third and fifth harmonics of the first square wave,
wherein the first product is generated with a first gain, the second product is generated with a second gain equaling $(1/\sqrt{2})$ times the first gain, and the third product is generated with a third gain equaling $(1/\sqrt{2})$ times the first gain, wherein $\sqrt{}$ represents a square-root operation,
wherein the input signal is a sinusoid representing a reflection of a continuous wave (CW) ultrasound signal from an object, wherein the CW ultrasound signal is a sinusoid having the first frequency;
a clock generator to receive a square wave as an input clock, the clock generator operating to generate each of a plurality of clocks with a corresponding phase, each of the plurality of clocks having a square wave shape, wherein each of the first square wave, the second square wave and the third square wave are comprised in the plurality of clocks;
wherein phases of clocks in the plurality of clocks are spaced at forty five degrees,
a fourth mixer coupled to receive the input signal, the fourth mixer to multiply the input signal with a fourth square wave to generate a fourth product, the fourth square wave having the first frequency, the first amplitude, and a fifth phase;
a fifth mixer coupled to receive the input signal, the fifth mixer to multiply the input signal with a fifth square wave to generate a fifth product, wherein a frequency of the fifth square wave equals the first frequency, and a phase of the fifth square wave leads the fifth phase by a third value;
a sixth mixer coupled to receive the input signal, the sixth mixer to multiply the input signal with a sixth square wave to generate a sixth product, wherein a frequency of the sixth square wave equals the first frequency, and a phase of the sixth square wave lags the fifth phase by a fourth value,
wherein the fourth square wave, the fifth square wave and the sixth square wave are comprised in the plurality of clocks,
wherein the combiner is coupled also to receive the fourth product, the fifth product, and the sixth product, and to add a second sum of the fourth product, the fifth product and the sixth product to the first sum to generate a third sum,
whereby the third sum represents a result of a mixing operation of the input signal with a seventh square wave having a phase that leads or lags the phase of one of the plurality of clocks by 22.5 degrees,
whereby the third sum is rendered free of mixing products due to the third and fifth harmonics of the seventh square wave.

2. An integrated circuit (IC) comprising:
a low-noise amplifier (LNA) to receive an input signal and to generate an amplified signal;
a mixer block to mix the amplified signal with a first square wave to generate a mixer output; and
a low-pass filter (LPF) to perform a low-pass filtering operation on the mixer output to generate an output signal;
wherein the mixer block comprises:
a first mixer coupled to receive the amplified signal, and to multiply the amplified signal with the first square wave to generate a first product;
a second mixer coupled to receive the amplified signal, and to multiply the amplified signal with a second square wave to generate a second product, wherein a frequency of the second square wave equals a frequency of the first square wave, and a phase of the second square wave leads a phase of the first square wave by forty five degrees;
a third mixer coupled to receive the amplified signal, and to multiply the amplified signal with a third square wave to generate a third product, wherein a frequency of the third square wave equals the frequency of the first square wave, and a phase of the third square wave lags the phase of the first square wave by forty five degrees; and
a combiner coupled to receive the first product, the second product and the third product, and to generate a first sum of the first product, the second product and the third product,
a clock generator to receive a square wave as an input clock, the clock generator operating to generate each of a plurality of clocks with a corresponding phase, each of the plurality of clocks having a square wave shape, wherein each of the first square wave, the second square wave and the third square wave are comprised in the plurality of clocks,
wherein phases of clocks in the plurality of clocks are spaced at forty five degrees,
the mixer block further comprising:
a fourth mixer coupled to receive the amplified signal, and to multiply the amplified signal with a fourth square wave to generate a fourth product, wherein a frequency of the fourth square wave equals the frequency of the first square wave;
a fifth mixer coupled to receive the amplified signal, and to multiply the amplified signal with a fifth square wave to generate a fifth product, wherein a frequency of the fifth square wave equals a frequency of the first square wave, and a phase of the fifth square wave leads a phase of the fourth square wave by forty five degrees;
a sixth mixer coupled to receive the amplified signal, and to multiply the amplified signal with a sixth square wave to generate a sixth product, wherein a frequency of the sixth square wave equals the frequency of the first square wave, and a phase of the sixth square wave lags the phase of the fourth square wave by forty five degrees, wherein the fourth square wave, the fifth square wave and the sixth square wave are comprised in the plurality of clocks, wherein the combiner is coupled also to receive the fourth product, the fifth product, and the sixth product, and to add a second sum of the fourth product, the fifth product and the sixth product to the first sum to generate a third sum, whereby the third sum represents a result of a mixing operation of the input signal with a seventh square wave having a phase that leads or lags the phase of one of the plurality of clocks by 22.5 degrees, whereby the third sum is rendered free of mixing products due to the third and fifth harmonics of the seventh square wave.

3. An ultrasound system comprising:

a transmit processor to transmit a continuous wave (CW) transmit signal;

a receive processor to receive one or more reflected CW signals, the receive processor comprising a plurality of processing chains including a first processing chain, the first processing chain comprising:

a low-noise amplifier (LNA) to receive a first one of the one or more reflected CW signals as an input signal and to generate an amplified signal;

a mixer block to generate a mixer output representing a frequency difference of the CW transmit signal and the amplified signal; and a low-pass filter (LPF) to perform a low-pass filtering operation on the mixer output to generate an output signal;

wherein the mixer block comprises:

a first mixer coupled to receive the amplified signal, and to multiply the amplified signal with a first square wave to generate a first product;

a second mixer coupled to receive the amplified signal, and to multiply the amplified signal with a second square wave to generate a second product, wherein a frequency of the second square wave equals a frequency of the first square wave, and a phase of the second square wave leads a phase of the first square wave by forty five degrees;

a third mixer coupled to receive the amplified signal, and to multiply the amplified signal with a third square wave to generate a third product, wherein a frequency of the third square wave equals the frequency of the first square wave, and a phase of the third square wave lags the phase of the first square wave by forty five degrees; and a combiner coupled to receive the first product, the second product and the third product, and to generate a first sum of the first product, the second product and the third product as the mixer output;

a summing block to add the output signal and output signals of the other chains in the plurality of processing chains to generate a summed output;

an analog to digital converter (ADC) to generate a sequence of digital values representing the summed output; and a processor to process the summed output to compute a velocity of an object that generates the one or more reflected CW signals;

a clock generator to receive a square wave as an input clock, the clock generator operating to generate each of a plurality of clocks with a corresponding phase, each of the plurality of clocks having a square wave shape, wherein each of the first square wave, the second square wave and the third square wave are comprised in the plurality of clocks, wherein phases of clocks in the plurality of clocks are spaced at forty five degrees, the mixer block further comprising:

a fourth mixer coupled to receive the amplified signal, and to multiply the amplified signal with a fourth square wave to generate a fourth product, wherein a frequency of the fourth square wave equals the frequency of the first square wave;

a fifth mixer coupled to receive the amplified signal, and to multiply the amplified signal with a fifth square wave to generate a fifth product, wherein a frequency of the fifth square wave equals a frequency of the first square wave, and a phase of the fifth square wave leads a phase of the fourth square wave by forty five degrees;

a sixth mixer coupled to receive the amplified signal, and to multiply the amplified signal with a sixth square wave to generate a sixth product, wherein a frequency of the sixth square wave equals the frequency of the first square wave, and a phase of the sixth square wave lags the phase of the fourth square wave by forty five degrees, wherein the fourth square wave, the fifth square wave and the sixth square wave are comprised in the plurality of clocks, wherein the combiner is coupled also to receive the fourth product, the fifth product, and the sixth product, and to add a second sum of the fourth product, the fifth product and the sixth product to the first sum to generate the mixer output, whereby the mixer output represents a result of a mixing operation of the input signal with a seventh square wave having a phase that leads or lags the phase of one of the plurality of clocks by 22.5 degrees, whereby the mixer output is rendered free of mixing products due to the third and fifth harmonics of the seventh square wave.

4. A method of generating a mixing product of an input signal with a first square wave, the method being performed in a mixer block, the method comprising:

multiplying by a first mixer the input signal with the first square wave to generate a first product;

multiplying by a second mixer the input signal with a second square wave to generate a second product, wherein a frequency of the second square wave equals a frequency of the first square wave, wherein a phase of the second square wave leads a phase of the first square wave by a first value;

multiplying by a third mixer the input signal with a third square wave to generate a third product, wherein a frequency of the third square wave equals a frequency of the first square wave, wherein a phase of the third square wave lags a phase of the first square wave by a second value;

adding the first product, the second product and the third product to generate a sum; and amplifying the sum, wherein each of the first value and the second value equals forty five degrees, wherein the first product is generated with a first gain, the second product is generated with a second gain equaling $(1/\sqrt{2})$ times the first gain, and the third product is generated with a third gain equaling $(1/\sqrt{2})$ times the first gain, wherein $\sqrt{}$ represents a square-root operation, wherein the input signal is a sinusoid representing a reflection of a continuous wave (CW) ultrasound signal from an object, receiving the amplified signal, and to multiply the amplified signal with a fourth square wave to generate a fourth product, wherein a frequency of the fourth square wave equals the frequency of the first square wave;

receiving the amplified signal, and to multiply the amplified signal with a fifth square wave to generate a fifth product, wherein a frequency of the fifth square wave equals a frequency of the first square wave, and a phase of the fifth square wave leads a phase of the fourth square wave by forty five degrees;

receiving the amplified signal, and to multiply the amplified signal with a sixth square wave to generate a sixth product, wherein a frequency of the sixth square wave equals the frequency of the first square wave, and a phase of the sixth square wave lags the phase of the fourth square wave by forty five degrees, wherein the fourth square wave, the fifth square wave and the sixth square wave are comprised in the plurality of clocks, receiving the fourth product, the fifth product, and the sixth product, and to add a second sum of the fourth product, the fifth product and the sixth product to the first sum to generate the mixer output, whereby the output represents a result of a mixing operation of the input signal with a seventh square wave having a phase that leads or lags the phase of one of the plurality of clocks by 22.5 degrees, whereby the output is rendered free of mixing products due to the third and fifth harmonics of the seventh square wave.

* * * * *